United States Patent
Rayner, Jr. et al.

(10) Patent No.: US 12,205,803 B2
(45) Date of Patent: Jan. 21, 2025

(54) PRESSURE-INDUCED TEMPERATURE MODIFICATION DURING ATOMIC SCALE PROCESSING

(71) Applicant: Kurt J. Lesker Company, Jefferson Hills, PA (US)

(72) Inventors: Gilbert Bruce Rayner, Jr., Bellefonte, PA (US); Noel Christopher O'Toole, Aliquippa, PA (US)

(73) Assignee: Kurt J. Lesker Company, Jefferson Hills, PA (US)

( * ) Notice: Subject to any disclaimer, the term of this patent is extended or adjusted under 35 U.S.C. 154(b) by 0 days.

(21) Appl. No.: 17/679,448

(22) Filed: Feb. 24, 2022

(65) Prior Publication Data
US 2022/0270865 A1    Aug. 25, 2022

Related U.S. Application Data

(60) Provisional application No. 63/153,543, filed on Feb. 25, 2021.

(51) Int. Cl.
*H01J 37/32* (2006.01)
*C23C 16/455* (2006.01)
(Continued)

(52) U.S. Cl.
CPC .. *H01J 37/32834* (2013.01); *C23C 16/45525* (2013.01); *C23C 16/52* (2013.01);
(Continued)

(58) Field of Classification Search
None
See application file for complete search history.

(56) References Cited

U.S. PATENT DOCUMENTS

| 6,303,895 B1 | 10/2001 | Husain et al. |
| 7,601,393 B2 | 10/2009 | Chiang et al. |

(Continued)

FOREIGN PATENT DOCUMENTS

| WO | 02070142 A1 | 9/2002 |
| WO | 2021030336 A1 | 2/2021 |

OTHER PUBLICATIONS

Piazza et al., "Piezoelectric aluminum nitride thin films for microelectromechanical systems", MRS Bulletin, Nov. 2012, pp. 1051-1061, vol. 37.

(Continued)

*Primary Examiner* — Alexander M Weddle
(74) *Attorney, Agent, or Firm* — The Webb Law Firm

(57) ABSTRACT

An apparatus for atomic scale processing includes: a reactor having inner and outer surfaces; where at least a portion of the inner surfaces define an internal volume of the reactor; a fixture assembly positioned within the internal volume of the reactor having a surface configured to hold a substrate within the internal volume of the reactor; a vacuum pump in communication with the reactor; at least one reactor pressure control device; and a controller in communication with the at least one reactor pressure control device, where the controller is configured to activate and deactivate the at least one reactor pressure control device to increase and decrease the pressure within the internal volume of the reactor, where the increase in the pressure within the internal volume of the reactor increases the temperature of the substrate from an initial temperature.

9 Claims, 11 Drawing Sheets

(51) Int. Cl.
  *C23C 16/52* (2006.01)
  *H01L 41/39* (2013.01)
  *H10N 30/093* (2023.01)

(52) U.S. Cl.
  CPC ...... *H01J 37/321* (2013.01); *H01J 37/32449* (2013.01); *H10N 30/093* (2023.02); *H01J 2237/182* (2013.01)

(56) References Cited

U.S. PATENT DOCUMENTS

| | | |
|---|---|---|
| 9,695,510 B2 | 7/2017 | Rayner, Jr. |
| 2004/0025787 A1* | 2/2004 | Selbrede ............ C23C 16/4411 427/255.31 |
| 2005/0000937 A1* | 1/2005 | Chiang ............ C23C 16/45527 257/E21.582 |
| 2007/0269983 A1* | 11/2007 | Sneh .................. C23C 16/4488 118/724 |
| 2011/0311339 A1* | 12/2011 | Yasui ................ H01L 21/67201 414/217 |
| 2012/0058576 A1 | 3/2012 | Beck et al. |
| 2012/0269968 A1* | 10/2012 | Rayner, Jr. ........ H01J 37/32449 118/728 |
| 2018/0119283 A1* | 5/2018 | Fukazawa ............... C23C 16/34 |
| 2018/0366354 A1* | 12/2018 | Nguyen ................. H10N 10/13 |
| 2021/0313145 A1 | 10/2021 | Rayner, Jr. et al. |

OTHER PUBLICATIONS

Yamashita et al., "Dependence of the Decomposition of Trimethylaluminum on Oxygen Concentration", Journal of the Electrochemical Society, 2011, pp. H93-H96, vol. 158:2.

* cited by examiner

PRESSURE-INDUCED TEMPERATURE MODIFICATION DURING ATOMIC SCALE PROCESSING

CROSS REFERENCE TO RELATED APPLICATIONS

This application claims the benefit of U.S. Provisional Patent Application No. 63/153,543, filed Feb. 25, 2021, the disclosure of which is hereby incorporated by reference in its entirety.

BACKGROUND OF THE INVENTION

Field of the Invention

The present disclosure is directed to atomic scale processing and, more particularly, to apparatuses and methods for controlling the pressure of an internal volume of an atomic scale processing reactor to raise the temperature of a substrate.

Description of Related Art

Atomic scale processing techniques are of considerable interest for a wide range of applications including microelectromechanical systems (MEMS), electronics, energy storage, nanophotonics, and biomedical. These techniques include atomic layer deposition (ALD), area selective ALD (ASALD), and atomic layer etching (ALE). ALD is a chemical vapor deposition (CVD) technique based on sequential, self-limiting surface reactions between gas/vapor phase species, and active surface sites. ASALD is and ALD technique that takes advantage of differences in precursor reactivity between different starting surfaces to enable selective film growth. Unlike ALD and ASALD, which are based on layer-by-layer growth, ALE removes (or etches) material one layer at a time. More specifically, ALE techniques remove thin-modified surface layers with atomic scale control. Each of these methods described (i.e., ALD, ASALD and ALE) can be purely thermal or plasma-enhanced.

Due to the surface controlled nature of atomic scale processing, substrate temperature is of key importance for achieving deposition, as well as etch performance. The metalorganic precursors used for the various atomic scale processing techniques typically require a substrate temperature below 350° C.-400° C., depending on the precursor, to avoid thermal decomposition, thereby limiting process temperature. In some cases, however, film deposition and/or etch quality can be improved by sequentially increasing the substrate temperature beyond the maximum threshold for thermal decomposition of a given precursor during processing.

For example, trimethylaluminum (TMA) is a common precursor used for aluminum nitride ($AlN_x$) growth by plasma-enhanced ALD (PEALD). The piezoelectric properties of $AlN_x$ are of considerable interest for a variety of applications including MEMS technology. To achieve piezoelectric $AlN_x$, the film must be polycrystalline with a c-axis oriented wurtzite crystal structure and orientation.

However, traditional heating methods, such as the application of typical reactor wall and/or substrate heaters, cannot increase and then subsequently decrease the substrate temperature (from above the pyrolysis threshold of the metalorganic precursor) rapidly enough to avoid thermal decomposition, and also provide sufficient sample throughput. This limitation is applicable to R&D, as well as production scale applications.

SUMMARY OF THE INVENTION

In view of the foregoing, there is a current need in the art for a method of rapidly increasing and decreasing the pressure within an internal volume of a reactor for atomic scale processing, thereby invoking a corresponding rapid increase and decrease in the temperature of a substrate during atomic scale processing. In further view of the foregoing, there is a current need in the art for an apparatus for atomic scale processing that is configured to quickly increase and decrease the pressure within an internal volume of a reactor to quickly increase and decrease the temperature of a substrate.

In one aspect of the present disclosure, an apparatus for atomic scale processing includes: a reactor having inner and outer surfaces; where at least a portion of the inner surfaces define an internal volume of the reactor; a fixture assembly positioned within the internal volume of the reactor having a surface configured to hold a substrate within the internal volume of the reactor; a vacuum pump in communication with the reactor; at least one reactor pressure control device; and a controller in communication with the at least one reactor pressure control device, where the controller is configured to activate and deactivate the at least one reactor pressure control device to increase and decrease the pressure within the internal volume of the reactor, wherein the increase in the pressure within the internal volume of the reactor increases the temperature of the substrate from an initial temperature.

The initial temperature of the substrate may be between 100° C. and 600° C. The apparatus may further include a pressure gauge in communication with the internal volume of the reactor, where the controller is in communication with the pressure gauge and the at least one reactor pressure control device to increase and decrease the pressure within the internal volume of the reactor. The controller may activate the at least one reactor pressure control device to increase the pressure within the internal volume of the reactor by 0.001 Torr to 760 Torr. The activation of the at least one reactor pressure control device may increase the pressure within the internal volume of the reactor to increase the temperature of the substrate by at least 20° C. The at least one reactor pressure control device may include a throttle valve positioned between the reactor and vacuum pump, where the controller is in communication with the throttle valve and is configured to modify the conductance to increase and decrease the pressure within the internal volume of the reactor. The at least one reactor pressure control device may include the vacuum pump, where the controller is in communication with the vacuum pump and is configured to decrease and increase a pumping speed of the vacuum pump to increase and decrease the pressure within the internal volume of the reactor. The at least one reactor pressure control device may include an isolation valve positioned between the reactor and vacuum pump, where the controller is in communication with the isolation valve and is configured to activate and deactivate the isolation valve to increase and decrease the pressure within the internal volume of the reactor. The at least one reactor pressure control device may include at least one mass flow controller (MFC) upstream from and in communication with the reactor, where the controller is in communication with the at least one mass flow controller and is configured to increase and decrease process gas flow from the at least one mass flow controller to increase and decrease the pressure within the internal volume of the reactor.

In another aspect of the present disclosure, a method to increase the temperature of a substrate during atomic scale processing includes: providing a substrate on a surface of a fixture assembly positioned within an internal volume of a reactor; and forming or removing a film of a material on a surface of the substrate including: dosing the surface of the substrate with a first precursor; purging or evacuating the first precursor and/or volatile reaction byproducts from the internal volume of the reactor; dosing the surface of the substrate with a second precursor; purging or evacuating the second precursor and/or volatile reaction byproducts from the internal volume of the reactor; and activating and deactivating at least one reactor pressure control device at least once during the formation or removal of the film in order to increase and decrease the pressure within the internal volume of the reactor; where the increase in the pressure within the internal volume of the reactor increases the temperature of the substrate from an initial temperature.

The first and/or second precursor may include plasma species. The first precursor may be trimethylaluminum. The second precursor may include Ar, $N_2$, $H_2$, $NH_3$, or $N_2H_4$ plasma species, or some combination thereof. The initial temperature of the substrate may be between 100° C. and 600° C. The activating step may increase the pressure of the internal volume of the reactor by 0.001 Torr to 760 Torr. The activating step may increase the temperature of the substrate by at least 20° C. The at least one reactor pressure control device may include a throttle valve positioned between the reactor and vacuum pump, and where the activating and deactivating step may include activating and deactivating the throttle valve at least once during the formation or removal of the film in order to increase and decrease the pressure within the internal volume of the reactor. The at least one reactor pressure control device may include an isolation valve positioned between the reactor and vacuum pump, and where the activating and deactivating step may include activating and deactivating the isolation valve at least once during the formation or removal of the film in order to increase and decrease the pressure within the internal volume of the reactor. The at least one reactor pressure control device may include a vacuum pump downstream from and in communication with the reactor, and where the activating and deactivating step may include decreasing and increasing a pumping speed of the vacuum pump at least once during the formation or removal of the film in order to increase and decrease the pressure within the internal volume of the reactor. The at least one reactor pressure control device may include at least one mass flow controller upstream from and in communication with the reactor, and where the activating and deactivating step may include increasing and decreasing a process gas flow from the at least one mass flow controller to increase and decrease the pressure within the internal volume of the reactor.

In another aspect of the present disclosure, a controller in communication with at least one reactor pressure control device of an apparatus for atomic scale processing is configured to: activate and deactivate the at least one reactor pressure control device in order to increase and decrease the pressure within an internal volume of a reactor of the apparatus for atomic scale processing, where the increase in pressure within the internal volume of the reactor increases the temperature of a substrate positioned within the internal volume of the reactor from an initial temperature.

Various preferred and non-limiting examples or aspects of the present invention will now be described and set forth in the following numbered clauses:

Clause 1: An apparatus for atomic scale processing, comprising: a reactor having inner and outer surfaces; wherein at least a portion of the inner surfaces define an internal volume of the reactor; a fixture assembly positioned within the internal volume of the reactor having a surface configured to hold a substrate within the internal volume of the reactor; a vacuum pump in communication with the reactor; at least one reactor pressure control device; and a controller in communication with the at least one reactor pressure control device, wherein the controller is configured to activate and deactivate the at least one reactor pressure control device to increase and decrease the pressure within the internal volume of the reactor, wherein the increase in the pressure within the internal volume of the reactor increases the temperature of the substrate from an initial temperature.

Clause 2: The apparatus of clause 1, wherein the initial temperature of the substrate is between 100° C. and 600° C.

Clause 3: The apparatus of clause 1 or clause 2, further comprising a pressure gauge in communication with the internal volume of the reactor, wherein the controller is in communication with the pressure gauge and the at least one reactor pressure control device to increase and decrease the pressure within the internal volume of the reactor.

Clause 4: The apparatus of any of clauses 1-3, wherein the controller activates the at least one reactor pressure control device to increase the pressure within the internal volume of the reactor by 0.001 Torr to 760 Torr.

Clause 5: The apparatus of any of clauses 1-4, wherein the activation of the at least one reactor pressure control device increases the pressure within the internal volume of the reactor to increase the temperature of the substrate by at least 20° C.

Clause 6: The apparatus of any of clauses 1-5, wherein the at least one reactor pressure control device comprises a throttle valve positioned between the reactor and vacuum pump, wherein the controller is in communication with the throttle valve and is configured to modify the conductance to increase and decrease the pressure within the internal volume of the reactor.

Clause 7: The apparatus of any of clauses 1-6, wherein the at least one reactor pressure control device comprises the vacuum pump, wherein the controller is in communication with the vacuum pump and is configured to decrease and increase a pumping speed of the vacuum pump to increase and decrease the pressure within the internal volume of the reactor.

Clause 8: The apparatus of any of clauses 1-7, wherein the at least one reactor pressure control device comprises an isolation valve positioned between the reactor and the vacuum pump, wherein the controller is in communication with the isolation valve and is configured to activate and deactivate the isolation valve to increase and decrease the pressure within the internal volume of the reactor.

Clause 9: The apparatus of any of clauses 1-8, wherein the at least one reactor pressure control device comprises at least one mass flow controller upstream from and in communication with the reactor, wherein the controller is in communication with the at least one mass flow controller and is configured to increase and decrease process gas flow from the at least one mass flow controller to increase and decrease the pressure within the internal volume of the reactor.

Clause 10: A method to increase the temperature of a substrate during atomic scale processing, comprising: providing a substrate on a surface of a fixture assembly positioned within an internal volume of a reactor; and forming or removing a film of a material on a surface of the substrate comprising: dosing the surface of the substrate with a first precursor; purging or evacuating the first precursor and/or volatile reaction byproducts from the internal volume of the reactor; dosing the surface of the substrate with a second precursor; purging or evacuating the second precursor and/or volatile reaction byproducts from the internal volume of the reactor; and activating and deactivating at least one reactor pressure control device at least once during the formation or removal of the film in order to increase and decrease the pressure within the internal volume of the reactor; wherein the increase in the pressure within the internal volume of the reactor increases the temperature of the substrate from an initial temperature.

Clause 11: The method of clause 10, wherein the first and/or second precursor comprises plasma species.

Clause 12: The method of clause 10 or clause 11, wherein the first precursor is trimethylaluminum.

Clause 13: The method of any of clauses 10-12, wherein the second precursor comprises Ar, $N_2$, $H_2$, $NH_3$, or $N_2H_4$ plasma species, or some combination thereof.

Clause 14: The method of any of clauses 10-13, wherein the initial temperature of the substrate is between 100° C. and 600° C.

Clause 15: The method of any of clauses 10-14, wherein the activating step increases the pressure of the internal volume of the reactor by 0.001 Torr to 760 Torr.

Clause 16: The method of any of clauses 10-15, wherein the activating step increases the temperature of the substrate by at least 20° C.

Clause 17: The method of any of clauses 10-16, wherein the at least one reactor pressure control device comprises a throttle valve positioned between the reactor and vacuum pump, and wherein the activating and deactivating step comprises activating and deactivating the throttle valve at least once during the formation or removal of the film in order to increase and decrease the pressure within the internal volume of the reactor.

Clause 18: The method of any of clauses 10-17, wherein the at least one reactor pressure control device comprises an isolation valve positioned between the reactor and the vacuum pump, and wherein the activating and deactivating step comprises activating and deactivating the isolation valve at least once during the formation or removal of the film in order to increase and decrease the pressure within the internal volume of the reactor.

Clause 19: The method of any of clauses 10-18, wherein the at least one reactor pressure control device comprises a vacuum pump downstream from and in communication with the reactor, and wherein the activating and deactivating step comprises decreasing and increasing a pumping speed of the vacuum pump at least once during the formation or removal of the film in order to increase and decrease the pressure within the internal volume of the reactor.

Clause 20: The method of any of clauses 10-19, wherein the at least one reactor pressure control device comprises at least one mass flow controller upstream from and in communication with the reactor, and wherein the activating and deactivating step comprises increasing and decreasing a process gas flow from the at least one mass flow controller to increase and decrease the pressure within the internal volume of the reactor.

Clause 21: A controller in communication with at least one reactor pressure control device of an apparatus for atomic scale processing, wherein the controller is configured to: activate and deactivate the at least one reactor pressure control device in order to increase and decrease the pressure within an internal volume of a reactor of the apparatus for atomic scale processing, wherein the increase in pressure within the internal volume of the reactor increases the temperature of a substrate positioned within the internal volume of the reactor from an initial temperature.

DESCRIPTION OF THE INVENTION

Figure 1:
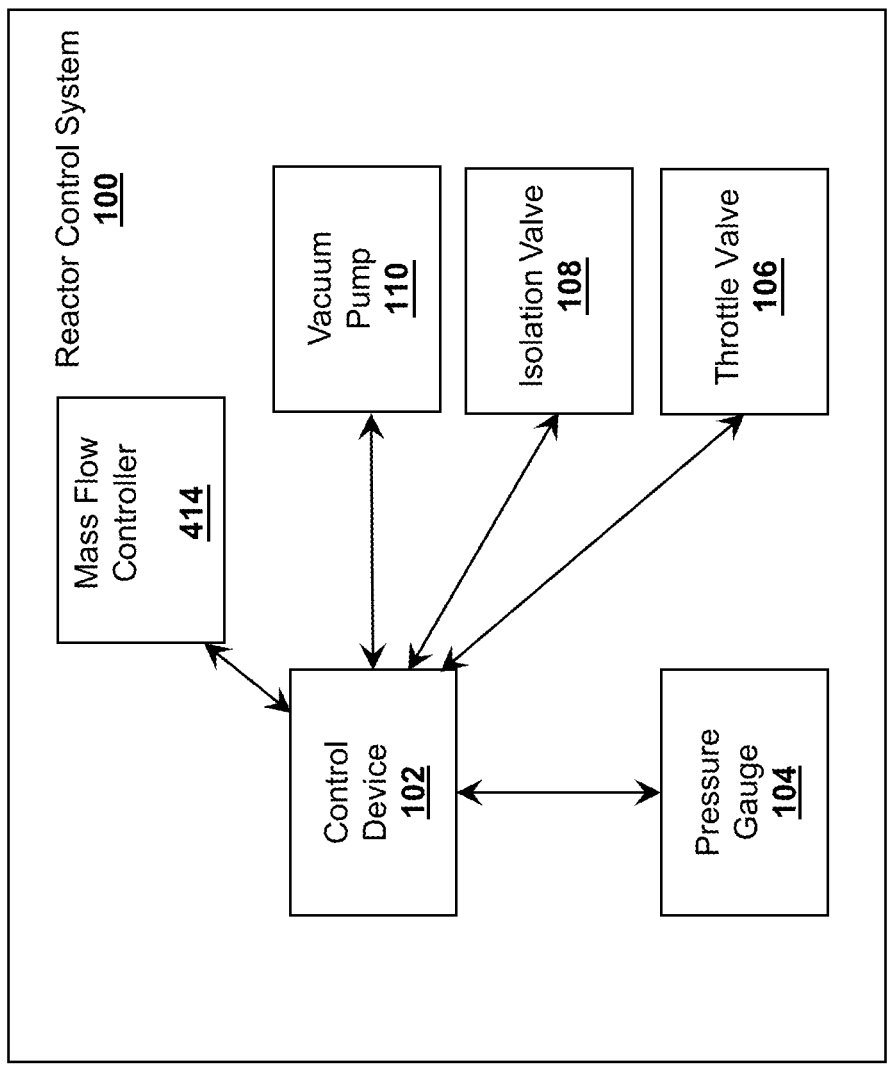
FIG. 1 is a diagram of a reactor control system according to one aspect of the present invention.

For purposes of the description hereinafter, spatial orientation terms, as used, shall relate to the referenced embodiment as it is oriented in the accompanying drawings, figures, or otherwise described in the following detailed description. However, it is to be understood that the embodiments described hereinafter may assume many alternative variations and configurations. It is also to be understood that the specific components, devices, features, and operational sequences illustrated in the accompanying drawings, figures, or otherwise described herein are simply exemplary and should not be considered as limiting.

For purposes of the description hereinafter, the terms "upper," "lower," "right," "left," "vertical," "horizontal," "top," "bottom," "lateral," "longitudinal," and derivatives thereof shall relate to the invention as it is oriented in the drawing figures. However, it is to be understood that the invention may assume alternative variations and step sequences, except where expressly specified to the contrary. It is also to be understood that the specific devices and processes illustrated in the attached drawings, and described in the following specification, are simply exemplary embodiments of the invention. Hence, specific dimensions and other physical characteristics related to the embodiments disclosed herein are not to be considered as limiting.

Also, it should be understood that any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

In this application, the use of the singular includes the plural and plural encompasses singular, unless specifically stated otherwise. In addition, in this application, the use of "or" means "and/or" unless specifically stated otherwise, even though "and/or" may be explicitly used in certain instances. Further, in this application, the use of "a" or "an" means "at least one" unless specifically stated otherwise.

The present disclosure is directed to, in general, an apparatus for atomic scale processing, and in particular, to an apparatus for atomic scale processing that is configured to increase the pressure within an internal volume of a reactor. The increase in the pressure within the internal volume of the reactor will increase the temperature of a substrate positioned within the internal volume of the reactor. Non-limiting examples of an apparatus for atomic scale processing and components thereof are illustrated in FIGS. 4-8.

According to one aspect, the apparatus for atomic scale processing may be configured to increase the pressure within the internal volume of the reactor. Various components of the apparatus may be configured to increase the pressure within the internal volume of the reactor. For example, a throttle valve, an isolation valve, a vacuum pump, and/or a mass flow controller (MFC) arrangement may be provided as a component of the apparatus for atomic scale processing and configured to increase the pressure within the internal volume of the reactor. These components (i.e., throttle valve, isolation valve, vacuum pump, and/or mass flow controller arrangement) may be activated by a control device to increase the pressure within the internal volume of the reactor. As used herein, "activate" refers to a change in the configuration of the component (e.g., set point, pumping speed, flow speed, and/or the like) in order to cause an increase in the pressure within the internal volume of the reactor. This increase in the pressure within the internal volume of the reactor will increase the temperature of the substrate positioned within the internal volume.

The apparatus for atomic scale processing may further be configured to, after the pressure within the internal volume of the reactor has been increased, decrease the pressure within the internal volume. The pressure within the internal volume of the reactor may be decreased by the same or different component(s) (i.e., throttle valve, isolation valve, vacuum pump, and/or mass flow controller arrangement) as was used to increase the pressure within the internal volume of the reactor. These components (i.e., throttle valve, isolation valve, vacuum pump, and/or mass flow controller arrangement) may be deactivated by the control device to decrease the pressure within the internal volume of the reactor. As used herein "deactivate" refers to a change in the configuration of the component (e.g., set point, pumping speed, flow speed, and/or the like) in order to cause a decrease in the pressure within the internal volume of the reactor. The decrease in the pressure within the internal volume of the reactor will decrease the temperature of the substrate positioned within the internal volume. The components (i.e., throttle valve, isolation valve, vacuum pump, and/or mass flow controller arrangement) may be commanded (e.g., activated and/or deactivated) by a control device, such as a controller.

For various metalorganic precursors, used for atomic scale processing, a substrate temperature below 350-400° C. is required to avoid thermal decomposition, thereby limiting the process temperature. However, film deposition and/or etch quality can be improved by sequentially increasing the substrate temperature beyond the maximum limit during processing. For example, trimethylaluminum (TMA) can be used as a precursor for aluminum nitride ($AlN_x$) growth by PEALD. The piezoelectric properties of $AlN_x$ are of interest for a variety of applications, such as, but not limited to, micro-electromechanical systems (MEMS). To achieve piezoelectric $AlN_x$, the film must be polycrystalline with a c-axis oriented wurtzite crystal structure. Elevated substrate temperature during growth, accomplished via the apparatuses and methods discussed herein, can be important to ensure the correct crystal structure and orientation.

Provided are improved apparatuses, methods, and control devices for atomic scale processing. Embodiments of the present disclosure may include an apparatus for atomic scale processing and at least one control device, where the control device is programmed or configured to command at least one reactor pressure control device of the apparatus for atomic scale processing to perform an action.

Referring to FIG. 1, FIG. 1 is a diagram of a reactor control system (100). As shown in FIG. 1, the reactor control system (100) may include a control device (102), a pressure gauge (104), a throttle valve (106), an isolation valve (108), a vacuum pump (110), and/or an MFC (414). The control device (102), the pressure gauge (104), the throttle valve (106), the isolation valve (108), the vacuum pump (110), and/or the MFC (414) may interconnect (e.g., establish a connection to communicate and/or the like) via wired connections, wireless connections, or a combination thereof.

The control device (102) may include a device that is capable of being in communication with the pressure gauge (104), the throttle valve (106), the isolation valve (108), the vacuum pump (110), and/or the MFC (414). The control device (102) may include a controller, a processor, an integrated circuit, and/or the like. The control device (102) may receive data associated with one or more components of the reactor control system (100). For example, the control device (102) may receive data associated with the pressure gauge (104) (e.g., pressure data). The control device (102) may provide commands (e.g., instructions, signals, and/or the like) to at least one reactor pressure control device of the reactor control system (100). For example, the control device (102) may provide commands to the throttle valve (106), the isolation valve (108), the vacuum pump (110), and/or the MFC (414). The control device (102) may provide commands based on the received data associated with one or more components of the reactor control system (100) (e.g., pressure gauge (104)). In some non-limiting embodiments, the control device (102) is not configured to receive data associated with one or more components of the reactor control system (100). In such an embodiment, the control device (102) may provide commands without receiving data associated with one or more components of the reactor control system (100).

The pressure gauge (104) may be capable of being in communication with the control device (102). The pressure gauge (104) may be configured to measure pressure and send the measured pressure data to the control device (102). For example, the pressure gauge (104) may be configured to measure the pressure of an internal volume (336) of a reactor (320), an exhaust port (316a), and/or a foreline (316b), as described below. The control device (102) may provide commands to at least one reactor pressure control device of the reactor control system (100) based on data received the pressure gauge (104). For example, the control device (102) may provide commands to the throttle valve (106), the isolation valve (108), the vacuum pump (110), and/or the MFC (414), based on the data received from the pressure gauge (104). In some non-limiting embodiments, the control device (102) may provide commands to at least one reactor pressure control device of the reactor control system (100) without receiving data from the pressure gauge (104).

Figure 2:
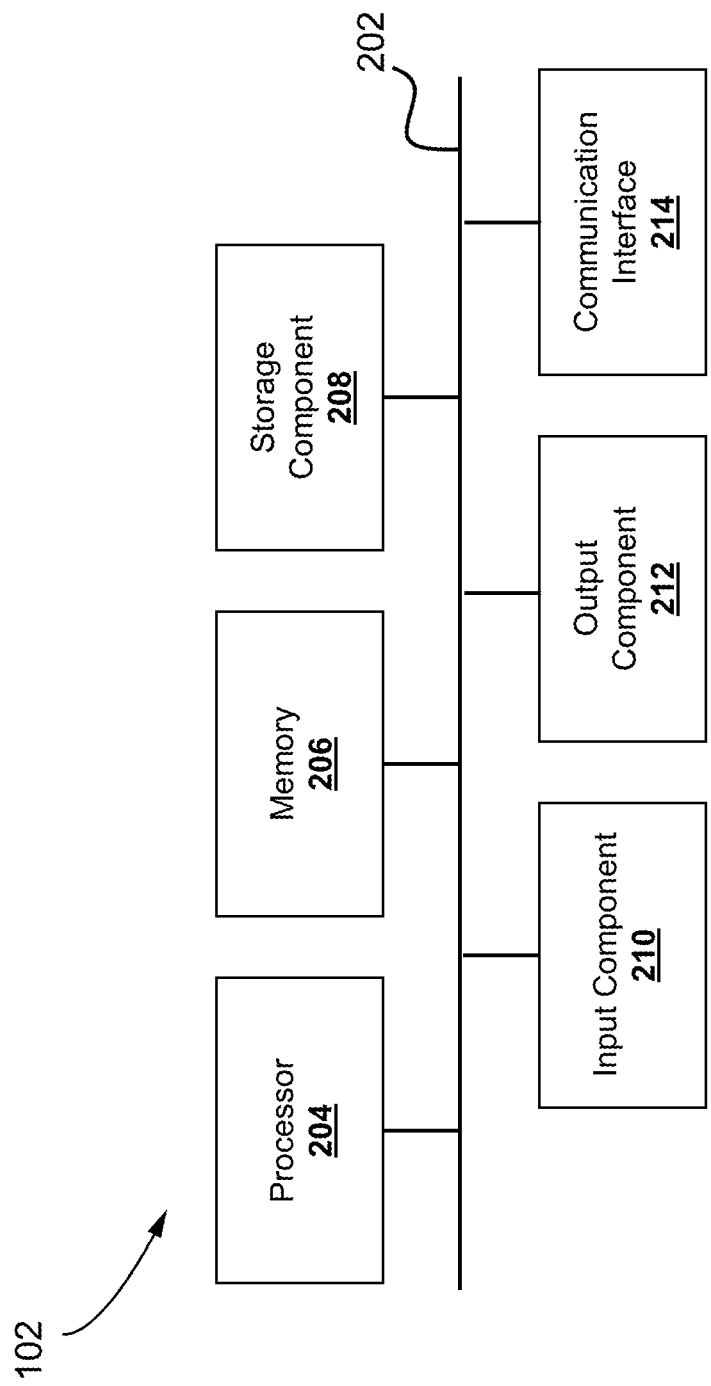
FIG. 2 is a diagram of components of a control device according to another aspect of the present invention.

Referring to FIG. 2, FIG. 2 is a diagram of example components of the control device (102). As shown in FIG. 2, the control device (102) may include a bus (202), a processor (204), memory (206), a storage component (208), an input component (210), an output component (212), and a communication interface (214).

The bus (202) may include a component that permits communication among the components of the control device (102). The processor (204) may be implemented in hardware, software, or a combination thereof. For example, the processor (204) may include a processor (e.g., a central processing unit (CPU), a graphics processing unit (GPU), an accelerated processing unit (APU), and/or the like), a microprocessor, a digital signal processor (DSP), and/or similar processing components that can be programmed to perform a function. Memory (206) may include random access memory (RAM), read-only memory (ROM), and/or another type of dynamic or static storage device (e.g., flash memory, magnetic memory, optical memory, and/or the like) that stores information, data, and/or instructions for use by the processor (204).

The storage component (208) may store information and/or software related to the operation and use of the control device (102). For example, storage component (208) may include a hard disk (e.g., a magnetic disk, an optical disk, a magneto-optic disk, a solid state disk, and/or the like), a compact disc (CD), a digital versatile disc (DVD), a floppy disk, a cartridge, a magnetic tape, and/or another type of computer-readable medium, along with a corresponding drive.

The input component (210) may include a component that permits the control device (102) to receive information, such as via user input (e.g., a touchscreen display, a keyboard, a keypad, a mouse, a button, a switch, a microphone, a camera, and/or the like). The output component (212) may include a component that provides output information from the control device (102) (e.g., a display, a speaker, one or more light emitting diodes (LEDS), and/or the like).

The communication interface (214) may include a transceiver-like component (e.g., a transceiver, a separate receiver and transmitter, and/or the like) that enables the control device (102) to communicate with other devices and/or components, such as via a wired connection, a wireless connection, or a combination thereof. The communication interface (214) may permit the control device (102) to receive information from another device and/or a component and/or provide information to another device and/or a component. For example, the communication interface (214) may include an Ethernet interface, an optical interface, a coaxial interface, an infrared interface, a radio frequency (RF) interface, a universal serial bus (USB) interface, a Wi-Fi® interface, a Bluetooth® interface, a Zigbee® interface, a cellular network interface, and/or the like.

The control device (102) may perform one or more processes described herein. The control device (102) may perform these processes based on processor (204) executing software instructions stored by a computer-readable medium, such as memory (206) and/or the storage component (208). A computer-readable medium (e.g., a non-transitory computer-readable medium) is defined herein as a non-transitory memory device. A non-transitory memory device includes memory space spread across multiple physical storage devices.

Software instructions may be read into memory (206) and/or the storage component (208) from another computer-readable medium or from another device and/or component via the communication interface (214). When executed, the software instructions stored in memory (206) and/or the storage component (208) may cause processor (204) to perform one or more processes described herein. Additionally or alternatively, hardwired circuitry may be used in place of or in combination with software instructions to perform one or more processes described herein. Thus, embodiments described herein are not limited to any specific combination of hardware circuitry and software.

Memory (206) and/or the storage component (208) may include data storage or one or more data structures (e.g., a database and/or the like). The control device (102) may be capable of receiving information from, storing information in, communicating information to, or searching information stored in the data storage or one or more data structures in memory (206) and/or the storage component (208). For example, the information may include input data, output data, and/or the like.

The number and arrangement of components shown in FIG. 2 are provided as an example. In some non-limiting embodiments, the control device (102) may include additional components, fewer components, different components, or differently arranged components than those shown in FIG. 2. Additionally, or alternatively, a set of components (e.g., one or more components) of the control device (102) may perform one or more functions described as being performed by another set of components of the control device (102).

Figure 3:
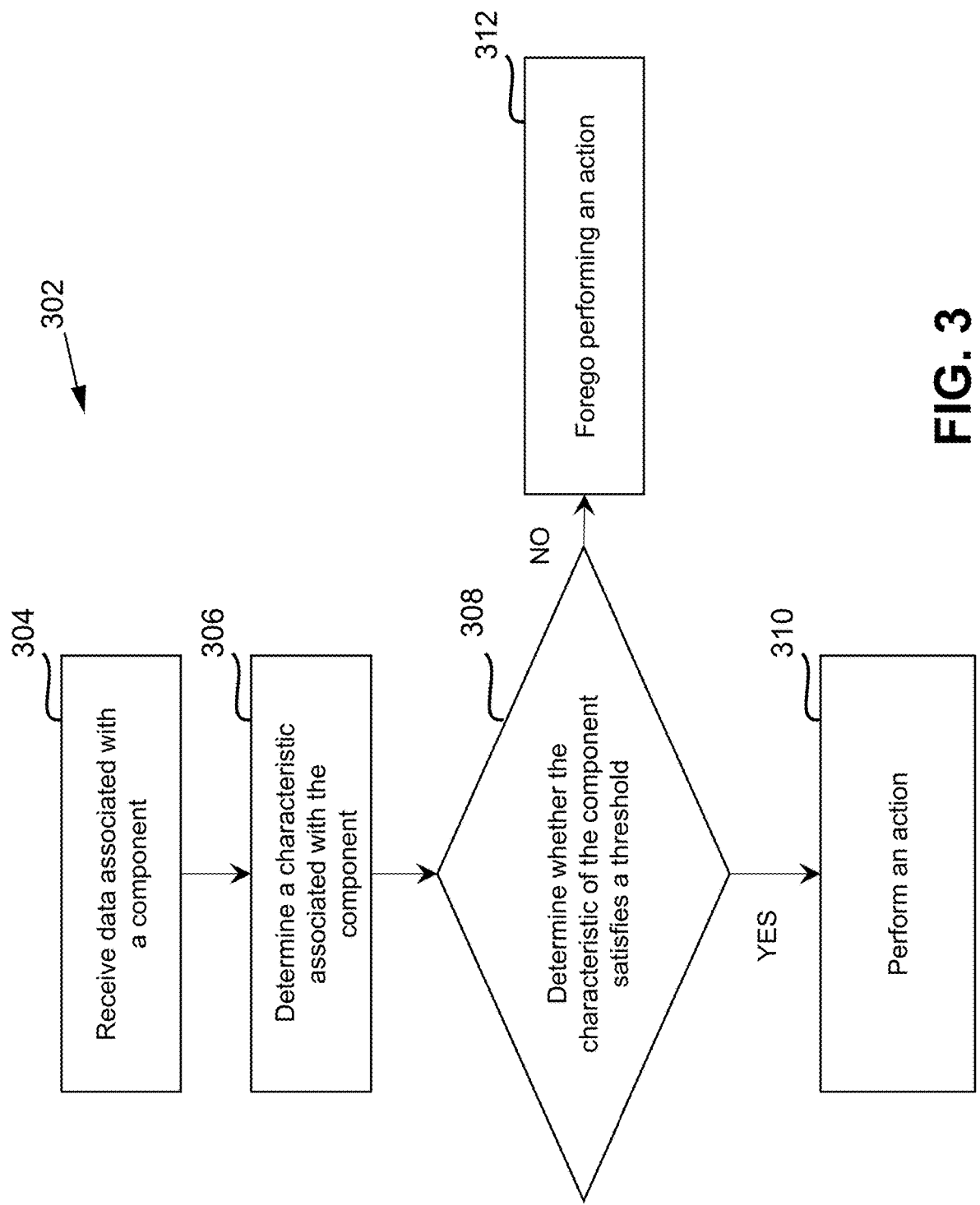
FIG. 3 is a diagram of a process to be performed by a control device according to another aspect of the present invention.

Referring to FIG. 3, FIG. 3 is a flowchart of a non-limiting embodiment of a process (302) that may be performed (e.g., completely, partially, etc.) by the control device (102). In some non-limiting embodiments, one or more of the steps of process (302) may be performed (e.g., completely, partially, and/or the like) by another device and/or component separate from and/or including the control device (102).

As shown in FIG. 3, at step (304), process (302) may include receiving data associated with a component. For example, control device (102) may receive the data associated with pressure gauge (104) from pressure gauge (104). In some non-limiting embodiments, the data associated with the pressure gauge (104) may include information (e.g., a characteristic, a parameter, etc.) that is determined (e.g., measured, detected, sensed, obtained, etc.) by the pressure gauge (104) in the course of operation of the pressure gauge (104).

As shown in FIG. 3, at step (306), process (302) may include determining a characteristic associated with the component. For example, the control device (102) may determine a characteristic associated with the pressure gauge (104). The control device (102) may determine pressure information associated with the pressure gauge (104). The pressure information associated with the pressure gauge (104) may include the pressure within the internal volume of the reactor, the pressure within the foreline, and/or the pressure within the exhaust port of the atomic scale processing apparatus described herein.

As shown in FIG. 3, at step (308), process (302) may include determining whether the characteristic of the component satisfies a threshold. For example, the control device (102) may determine whether the characteristic (e.g., pressure) associated with the pressure gauge (104) satisfies a threshold. The threshold may include a threshold value based on a pressure value. For example, the threshold may include a pressure value, that when below said pressure value, indicates that the reactor pressure is at an initial pressure for the reactor (i.e., the pressure within the internal volume of the reactor has not been raised).

As shown in FIG. 3, at step (310—"YES"), process (302) may include performing an action based on determining that the characteristic associated with the component satisfies the threshold. For example, the control device (102) may perform an action based on determining that the characteristic associated with the pressure gauge (104) satisfies the threshold. The control device (102) may perform an action based on determining that the pressure value associated with the pressure gauge (104) satisfies the threshold. For example, the control device (102) may perform an action based on determining that the pressure value associated with the pressure gauge (104) is below the threshold, indicating that the pressure within the internal volume of the reactor is at or near the initial pressure. The control device (102) may perform the action by activating at least one reactor pressure control device of the atomic scale processing apparatus as described herein to raise the pressure within the internal volume of the reactor. In some non-limiting embodiments, the control device (102) may require user input in order to confirm that the control device (102) is to perform the action by activating at least one reactor pressure control device of the atomic scale processing apparatus as described herein. After activating the at least one reactor pressure control device of the atomic scale processing apparatus, the control device (102) may perform another action. For example, after activating the at least one reactor pressure control device of the atomic scale processing apparatus, the control device (102) may perform another action by deactivating at least one reactor pressure control device of the atomic scale processing apparatus as described herein. In some non-limiting embodiments, the control device (102) may wait a predetermined amount of time after activating the at least one reactor pressure control device of the atomic scale processing apparatus before deactivating the at least one reactor pressure control device of the atomic scale processing apparatus described herein. In some non-limiting embodiments, the control device (102) may perform an action without receiving data from a component or determining if a characteristic of a component satisfies a threshold.

As shown in FIG. 3, at step (312—"NO"), process (302) may include foregoing performing an action based on determining that the characteristic associated with the component does not satisfy the threshold. For example, the control device (102) may forego performing an action based on determining that the characteristic associated with the pressure gauge (104) does not satisfy the threshold. The control device (102) may compare the pressure value associated with the pressure gauge (104) to the threshold, and, if the control device (102) determines that the pressure value associated with the pressure gauge (104) does not satisfy the threshold, the control device (102) may forego performing the action. For example, the control device (102) may compare the pressure value associated with the pressure gauge (104) to the threshold, and, if the control device (102) determines that the pressure value associated with the pressure gauge (104) is above the threshold, the control device (102) may forego performing the action. Alternatively, the control device (102) may compare the pressure value associated with the pressure gauge (104) to the threshold, and, if the control device (102) determines that the pressure value associated with the pressure gauge (104) is above the threshold, the control device (102) may deactivate at least one reactor pressure control device of the atomic scale processing apparatus described herein instead of foregoing an action.

Figure 4:
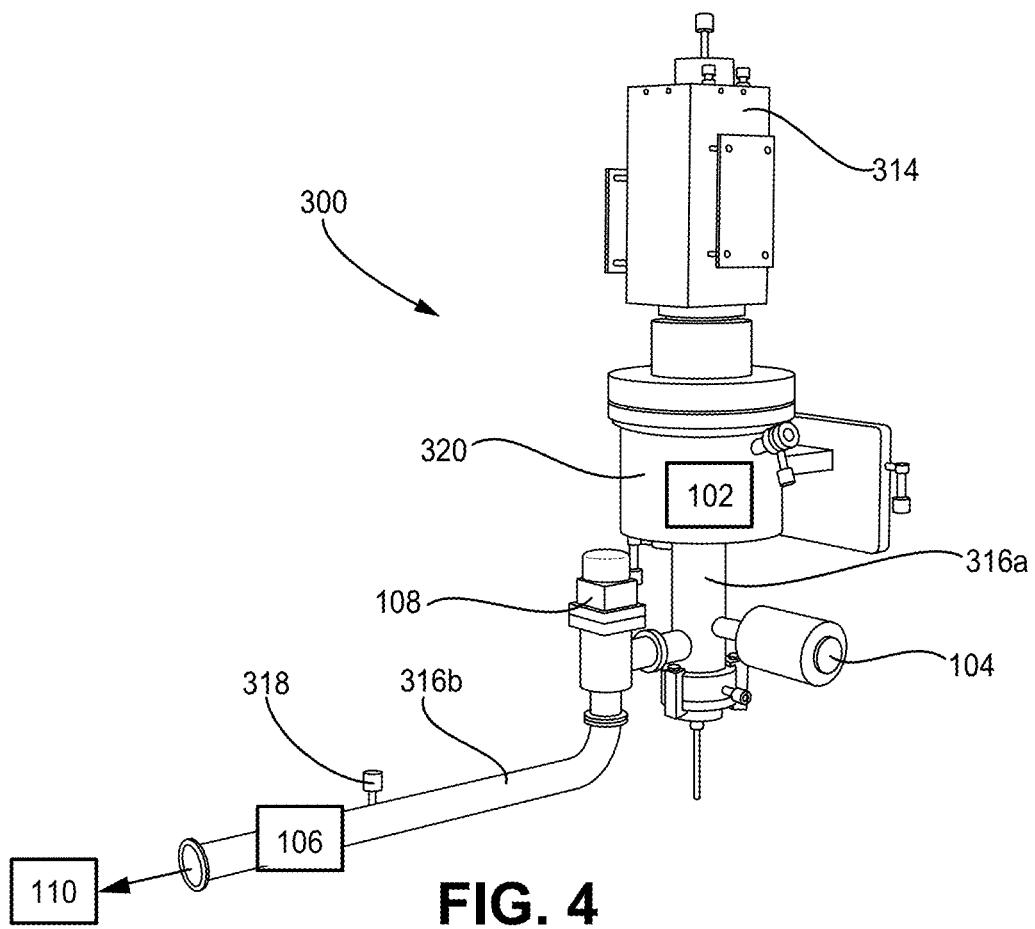
FIG. 4 is an isometric view of an apparatus for atomic scale processing according to another aspect of the present invention.

With reference to FIG. 4, an apparatus (300) for atomic scale processing that includes the control device (102) is provided. The apparatus (300) may include a reactor (320). An inductively coupled plasma (ICP) source (314) may be in communication with the reactor (320) and may be located above the reactor (320). A process gas source may be in direct communication with the ICP source (314), thereby allowing the process gas to flow into the ICP source (314). A process gas can consist of an inactive gas and/or one or more precursor/plasma gases such as $O_2$, $N_2$, $H_2$, $NH_3$, and/or the like. Therefore, the process gas source may also include one or more MFCs for controlling gas flow, located upstream from ICP source (314), which provides continuous, viscous-laminar inactive gas flow, and/or continuous or sequential precursor/plasma gas flow through the ICP source (314) to the reactor (320) (see FIG. 8).

The apparatus (300) may further include an exhaust port (316*a*) from the reactor (320) to a pump isolation valve (108) and a foreline (316*b*) from the pump isolation valve (108) to a vacuum pump (110). The apparatus (300) may further include a pressure gauge (104). The pressure gauge (104) may be located on, and configured to measure the pressure within, the reactor (320) (e.g., the internal volume (336) of the reactor (320)), the exhaust port (316*a*), and/or the foreline (316*b*). The apparatus (300) may further include a throttle valve (106). The throttle valve (106) may be located on the foreline (316*b*) and may be configured to obtain variable conductance between the reaction space volume within the internal volume (336) of the reactor (320) and the vacuum pump (110). The throttle valve (106) therefore can be used to control the effective pumping speed of the vacuum pump (110) to adjust residence time of species within the internal volume (336) of the reactor (320). The apparatus (300) may also include a throttle valve (106) upstream from the reactor (320) and in communication with the reactor (320) and a process gas source. The throttle valve (106) may therefore be used to adjust process gas flow from the process gas source to the reactor (320). The apparatus (300) may further include a downstream port (318). The downstream port (318) may be attached to and in communication with the foreline (316*b*). The downstream port (318) may provide purge and vent protection to reduce the potential for pump back-diffusion and back-streaming of impurities. For example, the downstream port (318) may be configured to provide continuous, viscous laminar gas flow (using an MFC arrangement, orifice, or some other suitable means of controlling gas flow) when the reactor (320) is not in communication with the vacuum pump (110).

The apparatus (300) may further include a control device (102) (e.g., a controller). The control device (102) may be located on a surface of one or more of the components of the apparatus (300). Alternatively, the control device (102) may be located in an area surrounding the apparatus (300). The control device (102) may be in communication (e.g., wired connection, wireless connection, or a combination thereof)

with one or more components of the apparatus (300). For example, the control device (102) may be in communication with the pressure gauge (104), the throttle valve (106), the isolation valve (108), and/or the vacuum pump (110). The control device may also be in communication with the MFC (414) (see FIG. 8).

Figure 5:
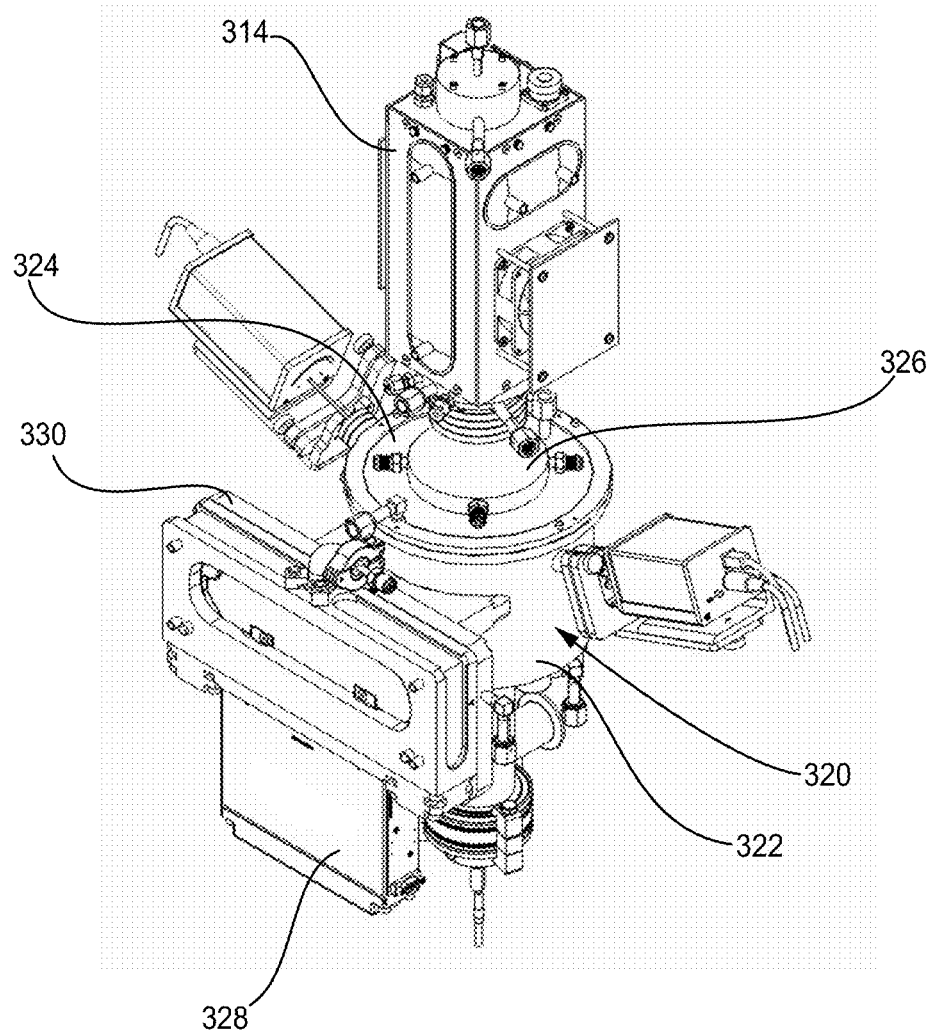
FIG. 5 is an isometric view of a reactor and additional components according to another aspect of the present invention.

With reference to FIG. 5, the reactor (320) may include a chamber (322) wherein atomic scale processing may be performed. A precursor input adaptor (326) may be provided and in communication with both the ICP source (314) and the reactor (320). A reactor lid (324) may be provided between the reactor (320) and the precursor input adaptor (326). A transfer port (330) may be in communication with the reactor (320) and located at the front of the reactor (320). A gate valve (328) may be in communication with the transfer port (330) and is configured to isolate the reactor (320). The transfer port (330) may enable substrate transfer for a variety of configurations including cluster tool arrangements enabling multi-technique capabilities. The gate valve (328) provides reactor isolation upon completion of substrate transfer.

Figure 6:
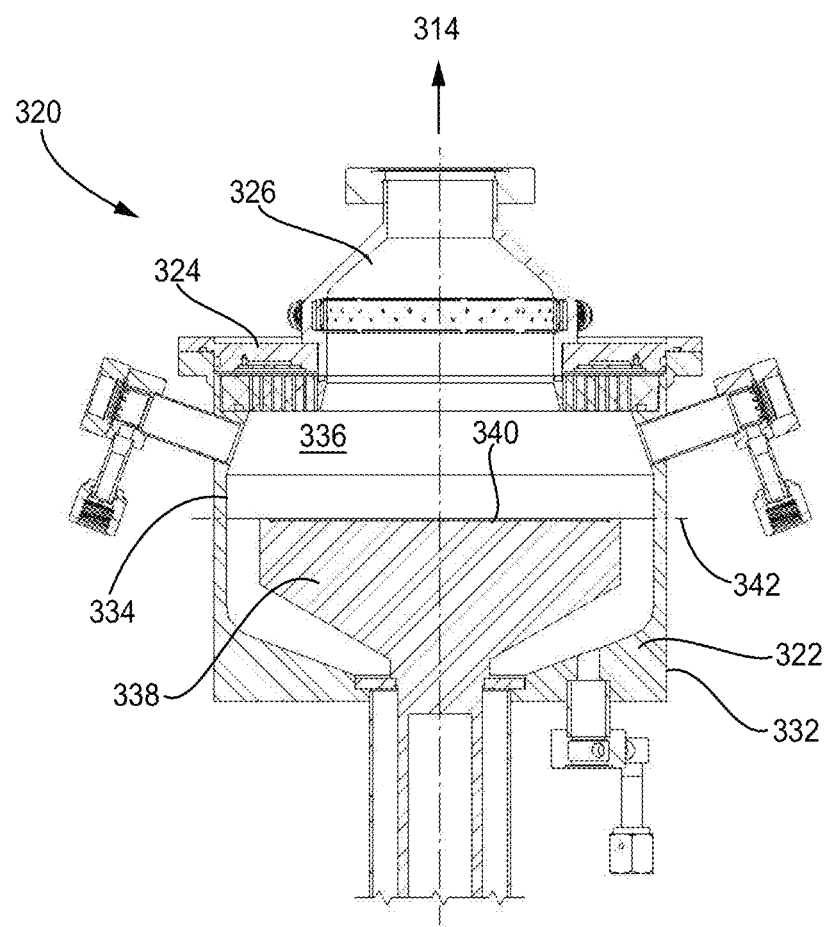
FIG. 6 is a cross-section of a reactor according to another aspect of the present invention.

With reference to FIG. 6, the reactor (320) may include outer surfaces (332) and inner surfaces (334) of the reactor (320). The inner surfaces (334) above the plane (342) may define an internal volume (336) of the reactor (320). A fixture assembly (338) may be positioned within the internal volume (336) of the reactor (320). A substrate (340) may be positioned on a surface of the fixture assembly (338) at plane (342) within the internal volume (336) of the reactor (320). The substrate (340) may include a material that is suitable for atomic scale processing. For example, the substrate (340) may include, but not limited to, silicon, germanium (Ge), III-V materials such as indium gallium arsenide, sapphire, quartz, and/or the like. The fixture assembly (338) may include a substrate heater that is configured to raise the temperature of the substrate (340) positioned within the internal volume (336) of the reactor (320). The chamber (322) of the reactor (320) may include a wall heater positioned in thermal contact with the outer surfaces (332) of the reactor (320) that is configured to raise the temperature of inner surfaces (334) of the reactor (320), as well as to raise the temperature of the substrate (340).

The wall heater and the substrate heater may heat the substrate (340) to an initial temperature. For example, the initial temperature of the substrate (340) may be at least 100° C., or at least 125° C., or at least 150° C., or at least 175° C., or at least 200° C., or at least 225° C., or at least 250° C. The initial temperature of the substrate (340) may be up to 600° C., or up to 550° C., or up to 525° C., or up to 500° C., or up to 450° C., or up to 425° C., or up to 400° C. The initial temperature of the substrate (340) may be between 100° C. and 600° C., or between 125° C. and 550° C., or between 150° C. and 525° C., or between 175° C. and 500° C., or between 200° C. and 450° C., or between 225° C. and 425° C., or between 250° C. and 500° C., or between 250° C. and 450° C., or between 250° C. and 400° C. The internal volume (336) of the reactor (320) may have an initial pressure. For example, the initial pressure of the internal volume (336) of the reactor (320) may be at least 0.001 Torr, or at least 0.01 Torr, or at least 0.1 Torr, or at least 0.2 Torr, or at least 0.5 Torr, or at least 1 Torr. The initial pressure of the internal volume (336) of the reactor (320) may be up to 3 Torr, or up to 2.5 Torr, or up to 2 Torr, or up to 1.5 Torr, or up to 1 Torr. The initial pressure of the internal volume (336) of the reactor (320) may be between 0.001 Torr and 3 Torr, or between 0.01 Torr and 2.5 Torr, or between 0.1 Torr and 2 Torr, or between 0.2 Torr and 1.5 Torr, or between 0.5 Torr and 1 Torr.

The apparatus (300) may be configured to perform various atomic scale processing techniques, thereby enabling the formation or removal of a film on the surface of a substrate with atomic scale control. For example, the apparatus (300) may be configured to form or remove a film, or a plurality of films, on a surface of the substrate (340). To form or remove the film on the surface of the substrate (340), the apparatus (300) may be configured to dose the surface of the substrate (340) with a first precursor, such as from a precursor vapor delivery arrangement (400) as discussed herein. Examples of the first precursor are not particularly limited, and may include any precursors for atomic scale processing known in the art. Examples of metal precursors that may be used for the first precursor include, but are not limited to, TMA, trisdimethylamino titanium (TDMAT), titanium tetrachloride ($TiCl_4$), trimethylgallium (TMG), trisdimethylamino hafnium (TDMAH), trisdimethylamino zirconium (TDMAZ), and/or the like. The apparatus (300) may be configured to purge or evacuate the first precursor and/or volatile reaction byproducts from the internal volume (336) of the reactor (320) after the first precursor has been dosed onto the surface of the substrate (340), and surface reactions are complete. The apparatus (300) may be configured to dose the surface of the substrate (340) with a second precursor. Examples of the second precursor are not particularly limited, and may include plasma species, such as from the ICP source (314). The plasma species may include, but are not limited to, Ar, $N_2$, $H_2$, $NH_3$, $N_2H_4$ or $O_2$ plasma species, or some combination thereof. Examples of other species that may be used as the second precursor include, but are not limited to, $Cl_2$, $C_2F_6$, $SF_6$, $CH_4$, HF, HCl, and/or the like. The apparatus (300) may be configured to purge or evacuate the second precursor and/or volatile reaction byproducts from the internal volume (336) of the reactor (320) after the second precursor has been dosed onto the surface of the substrate (340), and surface reactions are complete. The atomic scale processing sequence (or cycle) may include any number of additional precursor dose steps and corresponding purge or evacuation steps (e.g., dosing then purging or evacuating a third precursor, etc.). This atomic scale processing sequence (or cycle) may be repeated by the apparatus (300) any number of times, such as until the desired amount of material has been deposited or etched.

During the formation of a film via atomic scale processing, such as the PEALD technique previously described, the control device (102) may activate and/or deactivate at least one reactor pressure control device (e.g., the throttle valve (106), the isolation valve (108), the vacuum pump (110), and/or the MFC (414)) of the apparatus (300).

Referring back to FIG. 4, in some non-limiting embodiments, the throttle valve (106) may be adjusted to enable downstream pressure control. By adjusting the throttle valve (106) (i.e., set point: 0-100% open), the pressure within the internal volume (336) of the reactor (320) can be varied. The control device (102) may be configured to adjust (e.g., activate and/or deactivate) the throttle valve (106) to vary the pressure within the internal volume (336) of the reactor (320). The control device (102) may activate the throttle valve (106) by decreasing the set point of the throttle valve (106) (i.e., cycling the throttle valve towards 0%). In some non-limiting embodiments, activating the throttle valve (106) includes decreasing the set point to 0% (i.e., fully closed). In some non-limiting embodiments, activating the throttle valve (106) includes decreasing the set point to less than 50%, or less than 40%, or less than 30%, or less than 20%, or less than 10%. Activation of the throttle valve (106) will increase the pressure within the internal volume (336) of the reactor (320). The increase in the pressure within the internal volume (336) of the reactor (320) will increase the temperature of the substrate (340) positioned within the internal volume (336) of the reactor (320). After the throttle valve (106) has been activated to increase the pressure within the internal volume (336) of the reactor (320), the throttle valve (106) may be held at the activated set point for a predetermined amount of time. After the predetermined amount of time, the control device (102) may deactivate the throttle valve (106) by increasing the set point of the throttle valve (106) (i.e., cycling the throttle valve towards 100%). In some non-limiting embodiments, deactivating the throttle valve (106) includes increasing the set point to 100% (i.e., fully open). In some non-limiting embodiments, deactivating the throttle valve (106) includes increasing the set point to greater than 30%, or greater than 40%, or greater than 50%, or greater than 60%, or greater than 70%. Deactivation of the throttle valve (106) will decrease the pressure within the internal volume (336) of the reactor (320). The decrease in the pressure within the internal volume (336) will decrease the temperature of the substrate (340).

In some non-limiting embodiments, the isolation valve (108) may be adjusted to enable downstream pressure control. By adjusting the isolation valve (108) (i.e., set point: 0% "open"; 100% "closed") the pressure within the internal volume (336) of the reactor (320) can be varied. The isolation valve (108) may be adjusted while maintaining process gas flow. The control device (102) may be configured to adjust (e.g., activate and/or deactivate) the isolation valve (108) to vary the pressure within the internal volume (336) of the reactor (320). The control device (102) may activate the isolation valve (108) by closing the isolation valve (108). Activation of the isolation valve (108) will increase the pressure within the internal volume (336) of the reactor (320). The increase in the pressure within the internal volume (336) of the reactor (320) will increase the temperature of the substrate (340) positioned within the internal volume (336) of the reactor (320). After the isolation valve (108) has been activated to increase the pressure within the internal volume (336) of the reactor (320), the isolation valve (108) may be held closed for a predetermined amount of time. After the predetermined amount of time, the control device (102) may deactivate the isolation valve (108) by opening the isolation valve (108). Deactivation of the isolation valve (108) will decrease the pressure within the internal volume (336) of the reactor (320). The decrease in the pressure within the internal volume (336) will decrease the temperature of the substrate (340).

In some non-limiting embodiments, the pumping speed of the vacuum pump (110) may be varied to enable downstream pressure control. By varying the pumping speed (i.e., increasing and/or decreasing pumping speed) of the vacuum pump (110), the pressure within the internal volume (336) of the reactor (320) can be varied. The control device (102) may be configured to vary (e.g., activate and/or deactivate) the vacuum pump (110) to vary the pressure within the internal volume (336) of the reactor (320). The control device (102) may activate the vacuum pump (110) by decreasing the pumping speed of the vacuum pump (110). Activation of the vacuum pump (110) will increase the pressure within the internal volume (336) of the reactor (320). The increase in the pressure within the internal volume (336) of the reactor (320) will increase the temperature of the substrate (340) positioned within the internal volume (336) of the reactor (320). After the vacuum pump (110) has been activated to increase the pressure within the internal volume (336) of the reactor (320), the vacuum pump (110) may be held at the decreased pumping speed for a predetermined amount of time. After the predetermined amount of time, the control device (102) may deactivate the vacuum pump (110) by increasing the pumping speed of the vacuum pump (110). Deactivation of the vacuum pump (110) will decrease the pressure within the internal volume (336) of the reactor (320). The decrease in the pressure within the internal volume (336) will decrease the temperature of the substrate (340).

Figure 7:
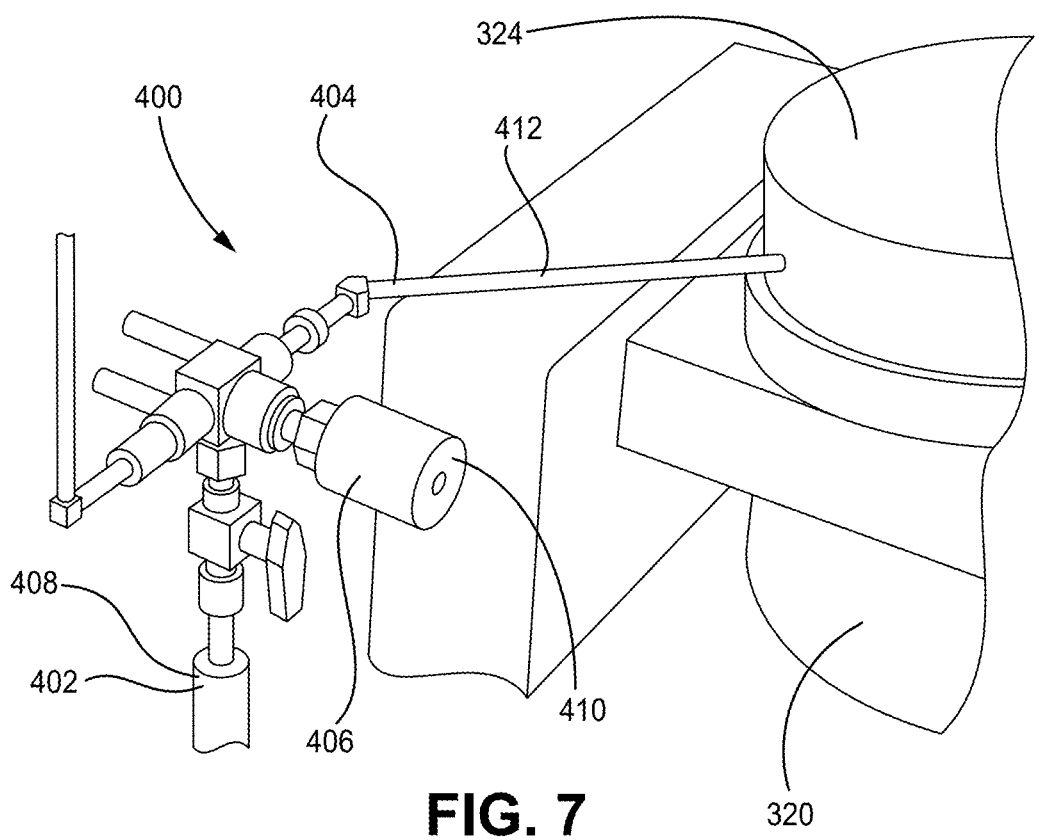
FIG. 7 is an isometric view of a precursor/reactant vapor delivery arrangement to a reactor according to another aspect of the present invention.

Referring to FIG. 7, a precursor (or reactant) vapor delivery arrangement (400) for delivering a precursor vapor to the reactor (320) is provided. One or more precursor vapor delivery arrangements (400) may be in communication with the reactor (320). The delivery components may include an ampoule (402) that includes a precursor for atomic scale processing. A line to the reactor (404) may be in communication with the ampoule (402) and reactor (320) such that the precursor may be transported to the reactor (320). The valving (406) may be attached to and in communication with the line to reactor (404). The valving (406) may be opened or closed to control the introduction of precursor vapor from the ampoule (402) into the line to the reactor (404). The precursor vapor delivery arrangement (400) also includes a MFC arrangement (112), located upstream from valving (406), which provides continuous, viscous-laminar inactive gas flow through valving (406) and line to the reactor (404) for effective vapor delivery and subsequent purging of the delivery components (see FIG. 8). The combination of continuous, inactive gas flow from the one or more said precursor vapor delivery arrangements (400) provides a continuous, viscous laminar flow through the reactor (100) and foreline (316b) to vacuum pump (110).

Figure 8:
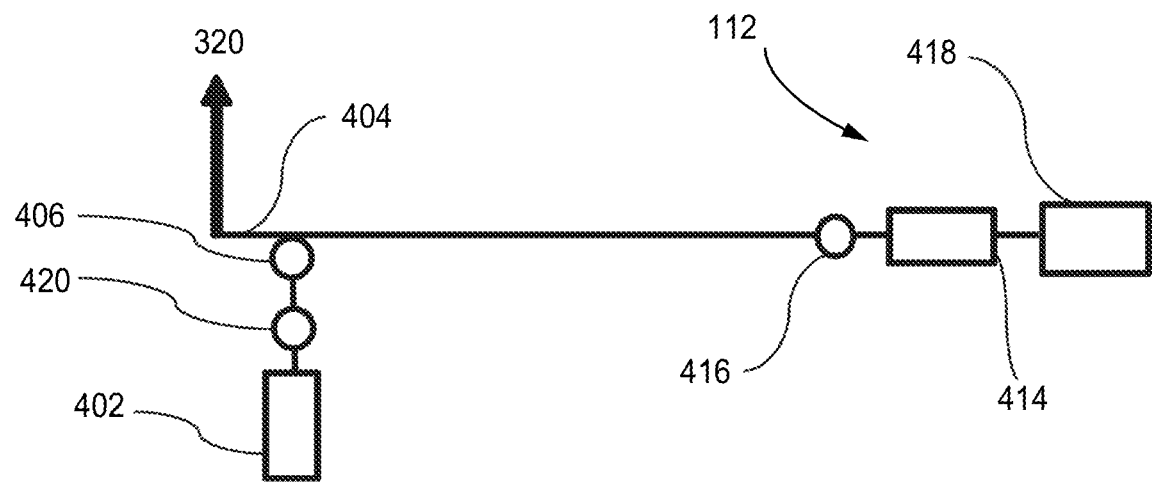
FIG. 8 is an schematic view of a mass flow controller (MFC) arrangement according to another aspect of the present invention.

With reference to FIG. 8, an MFC arrangement (112) is provided that may be implemented upstream from a precursor vapor or gas delivery arrangement (400) disclosed herein. As a non-limiting example, FIG. 8 includes the precursor vapor delivery arrangement (400) of FIG. 7, however, the MFC arrangement (112) may also, or alternatively, be implemented upstream from a process gas source. In FIG. 7, a precursor vapor delivery arrangement including an ampoule (402) with a manual valve (420) that may be open or closed, valving (406), and a line to the reactor (404) that connects the ampoule (402) to the reactor (320) are provided. If the manual valve (420) is open then the precursor vapor is able to exit the ampoule (402), and if the manual valve (420) is closed then the precursor vapor is unable to exit the ampoule (402). An MFC arrangement (112) is provided upstream of the precursor vapor delivery arrangement, or upstream from a process gas source in some non-limiting embodiments, and in communication with the valving (406) and the line to the reactor (404). The MFC arrangement (112) includes an inactive gas source (418). For example, the inactive gas source (418) may contain Ar or $N_2$. An MFC (414) may be in communication with the inactive gas source (418). The MFC (414) may be used to control the continuous flow of inactive Ar and/or $N_2$ process gas through the valving (406) and the line to the reactor (404). Continuous, viscous-laminar inactive gas flow serves as a carrier gas during precursor delivery/dose steps, and as a purge gas during subsequent purge steps. This inactive gas flow also creates a diffusion barrier to prevent unwanted back-diffusion of downstream impurities into the vapor delivery channel. The MFC arrangement (112) further includes a pneumatic diaphragm valve (416) that may be open or closed to allow or prevent inactive gas flow to the valving (406) and the line to the reactor (404). The pneumatic diaphragm valve (416) is in communication with both the MFC (414) and the valving (406).

In some non-limiting embodiments, the MFC (414) may be adjusted to enable upstream pressure control. By adjusting the process gas flow from the MFC (414), the pressure within the internal volume (336) of the reactor (320) can be varied. The control device (102) may be configured to adjust (e.g., activate and/or deactivate) the MFC (414) to vary the pressure within the internal volume (336) of the reactor (320). The control device (102) may activate the MFC (414) by increasing process gas flow from the MFC (414). Activation of the MFC (414) will increase the pressure within the internal volume (336) of the reactor (320). The increase in the pressure within the internal volume (336) of the reactor (320) will increase the temperature of the substrate (340) positioned within the internal volume (336) of the reactor (320). After the MFC (414) has been activated to increase the pressure within the internal volume (336) of the reactor (320), the increased process gas flow from the MFC (414) may be held for a predetermined amount of time. After the predetermined amount of time, the control device (102) may deactivate the MFC (414) by decreasing the process gas flow through the MFC (414). Deactivation of the MFC (414) will decrease the pressure within the internal volume (336) of the reactor (320). The decrease in the pressure within the internal volume (336) will decrease the temperature of the substrate (340).

Figure 9:
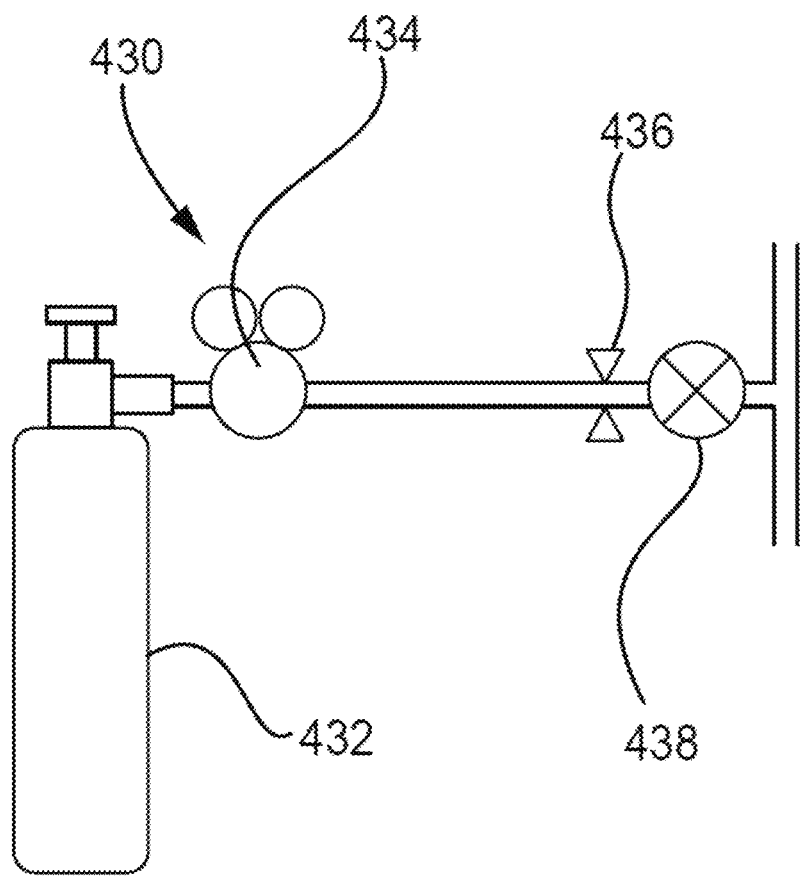
FIG. 9 is a schematic view of a precursor/reactant vapor delivery arrangement according to another aspect of the present invention.

Referring to FIG. 9, the apparatus (300) may include precursor/reactant vapor delivery arrangement (430) upstream from and in communication with reactor (320). The precursor/reactant vapor delivery arrangement (430) may include a compressed gas cylinder (432) that contains a precursor and is in communication with reactor (320). On the line that connects the compressed gas cylinder (432) to the reactor (320), a regulator (434) may be provided. Downstream from the regulator (434), an orifice (436) may be provided on the line that leads to reactor (320), followed by a valve (438). When a valve of the compressed gas cylinder (432) is open, such that precursor may flow out of the cylinder, the precursor gas will flow through the regulator (434), through orifice (436), through valve (438) and into the reactor (320). The regulator (434) may be used to control the line pressure between the compressed gas cylinder (432) and the reactor (320). The orifice (436) may be used to control flow, and the valve (438) may enable or disable the flow of precursor from the compressed gas cylinder (432) into reactor (320). In some non-limiting embodiments, precursor/reactant vapor delivery arrangement (430) may include more than one orifice (436) and (438) in parallel. Providing more than one orifice (436) and (438) in parallel between the compressed gas cylinder (432) and the reactor (320) may modify the magnitude of the pressure modification of the internal volume (336) of the reactor (320) described herein. In some non-limiting embodiments, a metering valve may be provided that enables adjustment of the orifice size of orifice (436). A metering valve that enables adjustment of the orifice size of orifice (436) may modify the magnitude of the pressure modification of the internal volume (336) of the reactor (320) as described herein.

In some non-limiting embodiments, the valve (438) may be adjusted to enable upstream pressure control, such that valve (438) may be considered at least one reactor pressure control device as described herein. By adjusting the valve (438) (i.e., set point: 0-100% open), the pressure within the internal volume (336) of the reactor (320) can be varied. The control device (102) may be configured to adjust (e.g., activate and/or deactivate) the valve (438) to vary the pressure within the internal volume (336) of the reactor (320). The control device (102) may activate the valve (438) by increasing the set point of the valve (438) (i.e., cycling the valve towards 100%). In some non-limiting embodiments, activating the valve (438) includes increasing the set point to 100% (i.e., fully open). In some non-limiting embodiments, activating the valve (438) includes increasing the set point to greater than 30%, or greater than 40%, or greater than 50%, or greater than 60%, or greater than 70%. Activation of the valve (438) will increase the pressure within the internal volume (336) of the reactor (320). The increase in the pressure within the internal volume (336) of the reactor (320) will increase the temperature of the substrate (340) positioned within the internal volume (336) of the reactor (320). After the valve (438) has been activated to increase the pressure within the internal volume (336) of the reactor (320), the valve (438) may be held at the activated set point for a predetermined amount of time. After the predetermined amount of time, the control device (102) may deactivate the valve (438) by decreasing the set point of the valve (438) (i.e., cycling the valve towards 0%). In some non-limiting embodiments, deactivating the valve (438) includes decreasing the set point to 0% (i.e., fully closed). In some non-limiting embodiments, deactivating the valve (438) includes decreasing the set point to less than 50%, or less than 40%, or less than 30%, or less than 20%, or less than 10%. Deactivation of the valve (438) will decrease the pressure within the internal volume (336) of the reactor (320). The decrease in the pressure within the internal volume (336) will decrease the temperature of the substrate (340).

The control device (102) may be configured to activate and/or deactivate at least one reactor pressure control device (e.g., the throttle valve (106), the isolation valve (108), the vacuum pump (110), and/or the MFC (414)) of the apparatus (300) at least once before, during, and/or after formation or removal of the film. In some non-limiting embodiments, the control device (102) may be configured to activate and/or deactivate at least one reactor pressure control device (e.g., the throttle valve (106), the isolation valve (108), the vacuum pump (110), and/or the MFC (414)) of the apparatus (300) at least once before, during, and/or after each cycle, or series of cycles, of the atomic scale processing technique for formation or removal of the film. For example, the apparatus (300) may be configured to perform a first cycle, or first series of cycles, of the atomic scale processing technique as described herein where the control device (102) is configured to activate and deactivate at least one reactor pressure control device of the apparatus (300) at least once before, during, and/or after the first cycle, or first series of cycles, and then, perform a second cycle, or second series of cycles, of the atomic scale processing technique as described herein wherein the control device (102) is configured to again activate and deactivate at least one reactor pressure control device of the apparatus (300) at least once before, during, and/or after the second cycle, or second series of cycles. This process may be continued for any number of cycles, or series of cycles, of the atomic scale processing technique performed by the apparatus (300) where the control device (102) is configured to activate and deactivate the at least one reactor pressure control device of the apparatus (300) at least once before, during, and/or after each cycle, or series of cycles. Activating and deactivating the at least one reactor pressure control device of the apparatus (300) at least once before, during, and/or after each cycle, or series of cycles, of the atomic scale processing technique performed by the apparatus (300) has the benefit of modifying film stresses, as well as improving crystal structure and orientation.

The activation of the at least one reactor pressure control device (e.g., the throttle valve (106), the isolation valve (108), the vacuum pump (110), and/or the MFC (414)) of the apparatus (300) may raise the pressure within the internal volume (336) of the reactor (320). The activation of the at least one reactor pressure control device of the apparatus (300) may raise the pressure within the internal volume (336) of the reactor (320) to at least 0.002 Torr, or at least 0.01 Torr, or at least 0.1 Torr, or at least 1 Torr, or at least 3, or at least 6 Torr. The activation of the at least one reactor pressure control device of the apparatus (300) may raise the pressure within the internal volume (336) of the reactor (320) to up to 760 Torr, or up to 100 Torr, or up to 9 Torr, or up to 6 Torr, or up to 1 Torr. The activation of the at least one reactor pressure control device of the apparatus (300) may raise the pressure within the internal volume (336) of the reactor (320) to between 0.002 Torr and 760 Torr, or between 0.01 Torr and 100 Torr, or between 0.1 Torr and 9 Torr, or between 1 Torr and 6 Torr, or between 6 Torr and 9 Torr, or between 0.002 Torr and 1 Torr, or between 0.01 Torr and 1 Torr, or between 0.1 Torr and 1 Torr.

The activation of the at least one reactor pressure control device of the apparatus (300) may raise the pressure within the internal volume (336) of the reactor (320) by at least 0.001 Torr, or at least 0.01 Torr, or at least 0.1 Torr, or at least 1 Torr, or at least 3 Torr, or at least 5 Torr. The activation of the at least one reactor pressure control device of the apparatus (300) may raise the pressure within the internal volume (336) of the reactor (320) by up to 760 Torr, or up to 100 Torr, or up to 20 Torr, or up to 9 Torr, or up to 5 Torr, or up to 1 Torr. The activation of the at least one reactor pressure control device of the apparatus (300) may raise the pressure within the internal volume (336) of the reactor (320) by between 0.001 Torr and 760 Torr, or between 0.01 Torr and 100 Torr, or between 0.1 Torr and 20 Torr, or between 1 Torr and 9 Torr, or between 3 Torr and 9 Torr, or between 5 Torr and 9 Torr, or between 0.001 Torr and 9 Torr, or between 0.01 Torr and 9 Torr, or between 0.1 Torr and 9 Torr, or between 0.001 Torr and 5 Torr, or between 0.001 Torr and 1 Torr.

The increase in the pressure within the internal volume (336) of the reactor (320) due to the activation of the at least one reactor pressure control device (e.g., the throttle valve (106), the isolation valve (108), the vacuum pump (110), and/or the MFC (414)) of the apparatus (300) may increase the temperature within the internal volume (336) of the reactor (320) which will increase the temperature of the substrate (340). The increase in the pressure within the internal volume (336) of the reactor (320) due to the activation of the at least one reactor pressure control device of the apparatus (300) may increase the temperature of the substrate (340) by at least 5° C., or by at least 10° C., or at least 20° C., or at least 30° C., or at least 40° C., or at least 50° C., or at least 75° C., or at least 100° C., or at least 115° C.

The increase in the pressure within the internal volume (336) of the reactor (320) due to the activation of the at least one reactor pressure control device of the apparatus (300) may increase the temperature of the substrate (340) to at least 105° C., or at least 150° C., or at least 200° C., or at least 250° C., or at least 300° C., or at least 350° C., or at least 400° C., or at least 450° C., or at least 500° C., or at least 550° C., or at least 600° C., or at least 650° C., or at least 700° C. The increase in the pressure within the internal volume (336) of the reactor (320) due to the activation of the at least one reactor pressure control device of the apparatus (300) may increase the temperature of the substrate (340) to up to 800° C., or up to 750° C., or up to 700° C., or up to 650° C., or up to 600° C., or up to 550° C., or at least 500° C., or at least 450° C., or at least 400° C., or at least 350° C., or at least 300° C., or at least 250° C., or at least 200° C., or at least 150° C. The increase in pressure within the internal volume (336) of the reactor (320) due to the activation of the at least one reactor pressure control device of the apparatus (300) may increase the temperature of the substrate (340) to between 105° C. to 800° C., or between 150° C. to 750° C., or between 200° C. to 700° C., or between 250° C. to 650° C., or between 300° C. to 600° C.

The deactivation of the at least one reactor pressure control device (e.g., the throttle valve (106), the isolation valve (108), the vacuum pump (110), and/or the MFC (414)) of the apparatus (300) may decrease the pressure within the internal volume (336) of the reactor (320). The deactivation of the at least one reactor pressure control device of the apparatus (300) may decrease the pressure within the internal volume (336) of the reactor (320) to at least 0.001 Torr, or at least 0.01 Torr, or at least 0.1 Torr, or at least 0.2 Torr, or at least 0.5 Torr, or at least 1 Torr. The deactivation of the at least one reactor pressure control device of the apparatus (300) may decrease the pressure within the internal volume (336) of the reactor (320) to up to 3 Torr, or up to 2.5 Torr, or up to 2 Torr, or up to 1.5 Torr, or up to 1 Torr. The deactivation of the at least one reactor pressure control device of the apparatus (300) may decrease the pressure within the internal volume (336) of the reactor (320) to between 0.001 Torr and 3 Torr, or between 0.01 Torr and 2.5 Torr, or between 0.1 Torr and 2 Torr, or between 0.2 Torr and 1.5 Torr, or between 0.5 Torr and 1 Torr.

The deactivation of the at least one reactor pressure control device of the apparatus (300) may decrease the pressure within the internal volume (336) of the reactor (320) by at least 0.001 Torr, or at least 0.01 Torr, or at least 0.1 Torr, or at least 1 Torr, or at least 3 Torr, or at least 5 Torr. The deactivation of the at least one reactor pressure control device of the apparatus (300) may decrease the pressure within the internal volume (336) of the reactor (320) by up to 760 Torr, or up to 100 Torr, or up to 20 Torr, or up to 9 Torr, or up to 5 Torr, or up to 1 Torr. The deactivation of the at least one reactor pressure control device of the apparatus (300) may decrease the pressure within the internal volume (336) of the reactor (320) by between 0.001 Torr and 760 Torr, or between 0.01 Torr and 100 Torr, or between 0.1 Torr and 20 Torr, or between 1 Torr and 9 Torr, or between 3 Torr and 9 Torr, or between 5 Torr and 9 Torr, or between 0.001 Torr and 9 Torr, or between 0.01 Torr and 9 Torr, or between 0.1 Torr and 9 Torr, or between 0.001 Torr and 5 Torr, or between 0.001 Torr and 1 Torr.

The decrease in the pressure within the internal volume (336) of the reactor (320) due to the deactivation of the at least one reactor pressure control device (e.g., the throttle valve (106), the isolation valve (108), the vacuum pump (110), and/or the MFC (414)) of the apparatus (300) may decrease the temperature within the internal volume (336) of the reactor (320) which will decrease the temperature of the substrate (340). The decrease in the pressure within the internal volume (336) of the reactor (320) due to the deactivation of the at least one reactor pressure control device of the apparatus (300) may decrease the temperature of the substrate (340) by at least 5° C., or by at least 10° C., or at least 20° C., or at least 30° C., or at least 40° C., or at least 50° C., or at least 75° C., or at least 100° C., or at least 115° C.

The decrease in the pressure within the internal volume (336) of the reactor (320) due to the deactivation of the at least one reactor pressure control device of the apparatus (300) may decrease the temperature of the substrate (340) to at least 100° C., or at least 125° C., or at least 150° C., or at least 175° C., or at least 200° C., or at least 225° C., or at least 250° C. The decrease in the pressure within the internal volume (336) of the reactor (320) due to the deactivation of the at least one reactor pressure control device of the apparatus (300) may decrease the temperature of the substrate (340) to up to 600° C., or up to 550° C., or up to 525° C., or up to 500° C., or up to 450° C., or up to 425° C., or up to 400° C. The decrease in the pressure within the internal volume (336) of the reactor (320) due to the deactivation of the at least one reactor pressure control device of the apparatus (300) may decrease the temperature of the substrate (340) to between 100° C. and 600° C., or between 125° C. and 550° C., or between 150° C. and 525° C., or between 175° C. and 500° C., or between 200° C. and 450° C., or between 225° C. and 425° C., or between 250° C. and 500° C., or between 250° C. and 450° C., or between 250° C. and 400° C.

In some non-limiting embodiments, the apparatus (300) may be configured to form or remove a film on a surface of the substrate (340) via an atomic scale processing technique as described above. At least once before, during, and/or after the formation or removal of the film, the pressure gauge (104) may be configured to communicate data to the control device (102), where the data includes information on the pressure within the internal volume (336) of the reactor (320). The control device (102) may process this data communicated from the control device (102). If the control device (102) determines that the pressure within the internal volume (336) of the reactor (320) is below a threshold (e.g., the pressure within the internal volume (336) of the reactor (320) is at the initial pressure of the internal volume (336) of the reactor (320) as discussed above), the control device (102) may activate at least one reactor pressure control device (e.g., the throttle valve (106), the isolation valve (108), the vacuum pump (110), and/or the MFC (414)) of the apparatus (300) to increase the pressure within the internal volume (336) of the reactor (320), where the increase in the pressure within the internal volume (336) of the reactor (320) increases the temperature of the substrate (340) positioned within the internal volume (336) of the reactor (320) from an initial temperature. After the at least one reactor pressure control device of the apparatus (300) has been activated, the pressure gauge (104) may be configured to communicate further data to the control device (102), where the data includes information on the pressure within the internal volume (336) of the reactor (320) after activation. The control device (102) may again process the data communicated from the control device (102). If the control device (102) determines that the pressure within the internal volume (336) of the reactor (320) is above a threshold (e.g., the pressure within the internal volume (336) of the reactor (320) is at the desired raised pressure after activation), the control device (102) may deactivate the at least one reactor pressure control device (e.g., the throttle valve (106), the isolation valve (108), the vacuum pump (110), and/or the MFC (414)) of the apparatus (300) to decrease the pressure within the internal volume (336) of the reactor (320), where the decrease in the pressure within the internal volume (336) of the reactor (320) decreases the temperature of the substrate (340) back to the initial temperature. In some non-limiting embodiments, the control device (102) may be configured to hold the increased pressure within the internal volume (336) of the reactor (320) after activation of the at least one reactor pressure control device of the apparatus (300) for a predetermined amount of time prior to deactivating the at least one reactor pressure control device of the apparatus (300). In some non-limiting embodiments, the control device (102) may activate and then deactivate at least one reactor pressure control device (e.g., the throttle valve (106), the isolation valve (108), the vacuum pump (110), and/or the MFC (414)) without receiving data from the pressure gauge (104).

The following Examples are presented to demonstrate the general principles of the invention of this disclosure and the effectiveness of pressure-induced temperature modification. The invention should not be considered as limited to the specific examples presented.

EXAMPLES

Example 1

The following Example was performed as follows. An apparatus for atomic scale processing was provided. Argon (Ar) gas flow was provided by a bank of MFC arrangements, where each MFC arrangement included a pneumatic diaphragm valve for complete disabling of Ar flow (i.e., for positive shut off). Communication between the MFC arrangement bank and the reactor/foreline was enabled by ¼ inch stainless steel tubing from each pneumatic diaphragm valve outlet connection to various connection points on the reactor/foreline. Ar gas flow was maintained at 1.1 standard liters/min (slm) through the reactor, foreline, and vacuum pump, resulting in a baseline pressure within the internal volume of the reactor of about 1 Torr, as measured by a pressure gauge positioned on the exhaust port of the atomic scale processing apparatus.

To determine substrate temperature as a function of reactor pressure, a 150 mm silicon (Si) substrate was embedded with nine K-type thermocouples that were spaced equidistantly from one another in a cross (+) pattern, and the substrate was then positioned on the top surface of a fixture assembly. The substrate heater and reactor wall temperatures were independently monitored, controlled, and recorded through the system control software. Dynamic pressure control was then enabled via communication between a throttle valve positioned on the foreline, the pressure gauge, and the system control software. The reactor pressure was monitored, systematically varied by adjusting the set point of the throttle valve, and recorded between about 1 Torr and 9 Torr through the system control software. The results of the reactor pressure variation testing is shown in FIGS. 10A-10B.

Figure 10A:
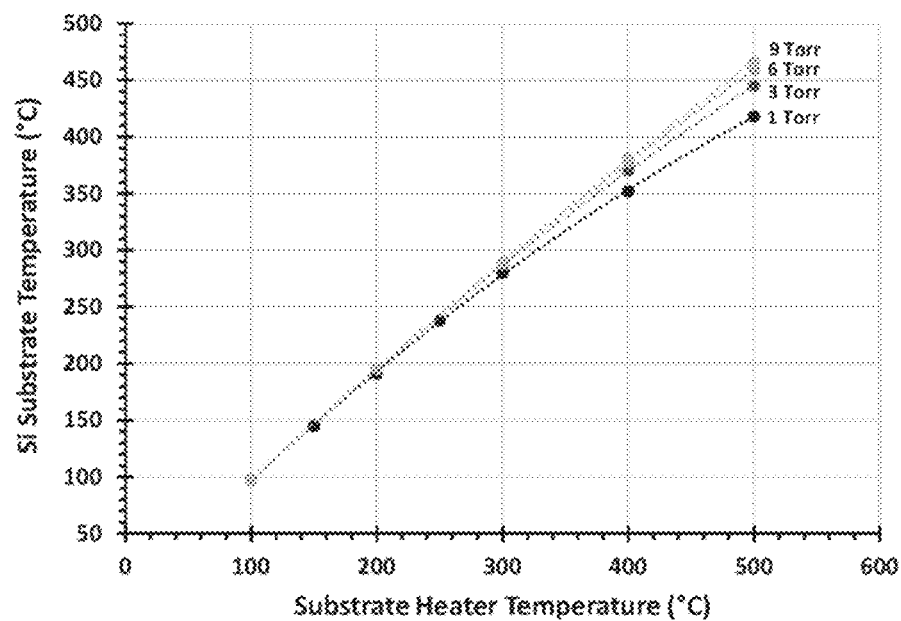
FIG. 10A is a graph of the substrate temperature versus the substrate heater temperature at different reactor internal volume pressures according to another aspect of the present invention.

As shown in FIG. 10A, the temperature of the substrate, for a given substrate heater temperature, is increased when the pressure within the internal volume of the reactor is increased. For example, if the substrate heater temperature is set at 500° C., the substrate temperature only reaches about 410° C. when the pressure within the internal volume of the reactor is about 1 Torr. However, when the pressure within the internal volume of the reactor is increased to about 9 Torr, the temperature of the substrate is increased to about 460° C. for a substrate heater temperature of 500° C. FIG. 10A further shows that the difference between the substrate temperature at a low pressure (e.g., 1 Torr) and the substrate temperature at a high pressure (e.g., 9 Torr) is greater at higher substrate heater temperatures (e.g., a substrate heater temperature of 500° C.).

Figure 10B:
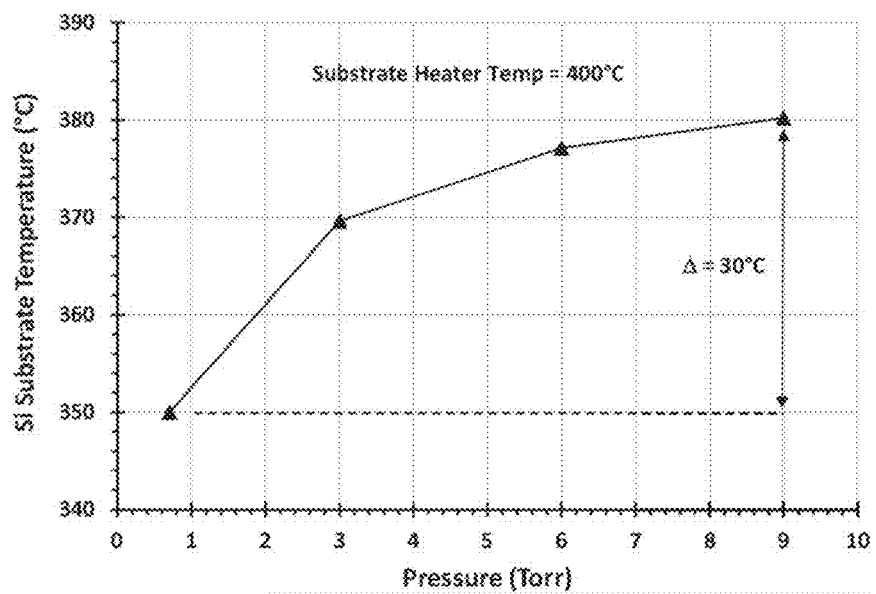
FIG. 10B is a graph of the substrate temperature versus the pressure of the internal volume of the reactor according to another aspect of the present invention.

Similarly, FIG. 10B shows the change in substrate temperature as the pressure of the internal volume of the reactor is increased, where the substrate heater temperature is held constant at 400° C. As shown in FIG. 10B, as the pressure within the internal volume of the reactor is increased from about 1 Torr to 9 Torr, the substrate temperature increases by 30° C., even though the substrate heater temperature remains constant.

Example 2

The following Examples were prepared as follows. An apparatus for atomic scale processing was provided. Argon (Ar) gas flow was provided by a bank of MFC arrangements, where each MFC arrangement included a pneumatic diaphragm valve for complete disabling of Ar flow (i.e., for positive shut off). Communication between the MFC arrangement bank and the reactor/foreline was enabled by ¼ inch stainless steel tubing from each pneumatic diaphragm valve outlet connection to various connection points on the reactor/foreline.

To determine substrate temperature as a function of reactor pressure, a 150 mm silicon (Si) substrate was embedded with nine K-type thermocouples that were spaced equidistantly from one another in a cross (+) pattern. The substrate was then positioned on the top surface of a fixture assembly and subjected to a substrate heater temperature of 300° C., 400° C., and 500° C. Dynamic pressure control was then enabled via communication between MFC arrangements, the pressure gauge, and the system control software. The reactor pressure was monitored, systematically varied by adjusting process gas flow through the MFC arrangement, and recorded between about 0.01 Torr and 1.04 Torr through the system control software. The results of reactor pressure variation testing (between about 0.01 Torr and 1.04 Torr) were combined with the results of reactor pressure variation testing shown in FIGS. 10A and 10B (between about 1 Torr and 9 Torr), with the combined results shown in FIG. 11.

Figure 11:
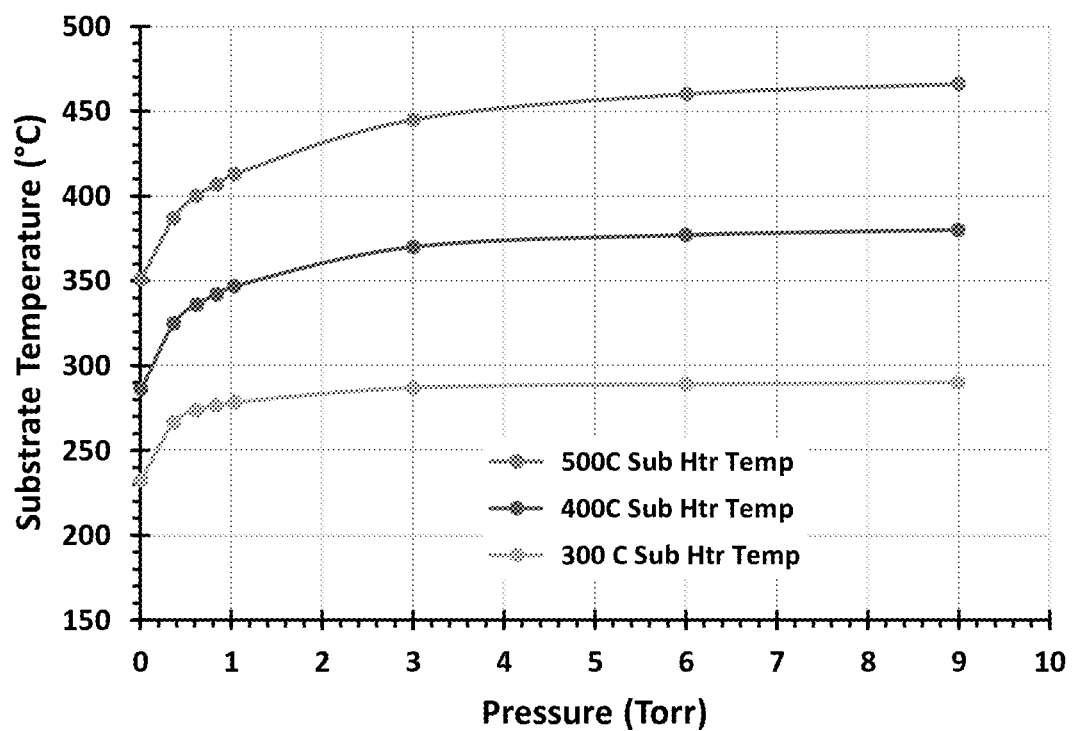
FIG. 11 is a graph of the substrate temperature versus the pressure of the internal volume of the reactor according to another aspect of the present invention.

As shown in FIG. 11, the substrate temperature significantly increased when the pressure within the internal volume of the reactor increased. For example, the substrate temperature increased by 115° C. for the substrate heater temperature of 500° C. when the pressure was increased from 0.01 Torr to 9 Torr. FIG. 11 also shows that the substrate temperature increases sharply at lower pressures, such as between 0.01 Torr and 1 Torr.

While several aspects of the present disclosure invention are shown in the accompanying figures and described in detail hereinabove, other aspects will be apparent to, and readily made by, those skilled in the art without departing from the scope and spirit of the disclosure. Accordingly the foregoing description is intended to be illustrative rather than restrictive. The invention described hereinabove is defined by the appended claims and all changes to the invention that fall within the meaning and range of equivalency of the claims are to be embraced within their scope.

The invention claimed is:

1. An apparatus for atomic scale processing, comprising:
    a reactor having inner and outer surfaces;
        wherein at least a portion of the inner surfaces define an internal volume of the reactor;
    a fixture assembly positioned within the internal volume of the reactor having a surface configured to hold a substrate within the internal volume of the reactor, wherein a portion of the internal volume is defined and positioned vertically above the substrate when the substrate is held on the fixture assembly;
    at least one reactor pressure control device; and
    a control device in communication with the at least one reactor pressure control device, wherein the control device is configured to activate and deactivate the at least one reactor pressure control device to increase and decrease the pressure within the portion of the internal volume of the reactor that is defined and positioned vertically above the substrate when the substrate is held on the fixture assembly, wherein the increase in the pressure within the portion of the internal volume of the reactor that is defined and positioned vertically above the substrate when the substrate is held on the fixture assembly increases the temperature of the substrate from an initial temperature.

2. The apparatus of claim 1, wherein the initial temperature of the substrate is between 100° C. and 600° C.

3. The apparatus of claim 1, further comprising a pressure gauge in communication with the internal volume of the reactor, wherein the control device is in communication with the pressure gauge and the at least one reactor pressure control device to increase and decrease the pressure within the internal volume of the reactor.

4. The apparatus of claim 1, wherein the control device activates the at least one reactor pressure control device to increase the pressure within the internal volume of the reactor by 0.001 Torr to 760 Torr.

5. The apparatus of claim 1, wherein the activation of the at least one reactor pressure control device increases the pressure within the internal volume of the reactor to increase the temperature of the substrate by at least 20° C.

6. The apparatus of claim 1, wherein the at least one reactor pressure control device comprises a throttle valve positioned between the reactor and a vacuum pump, wherein the control device is in communication with the throttle valve and is configured to modify the conductance to increase and decrease the pressure within the internal volume of the reactor.

7. The apparatus of claim 1, wherein the at least one reactor pressure control device comprises a vacuum pump, wherein the control device is in communication with the vacuum pump and is configured to decrease and increase a pumping speed of the vacuum pump to increase and decrease the pressure within the internal volume of the reactor.

8. The apparatus of claim 1, wherein the at least one reactor pressure control device comprises an isolation valve positioned between the reactor and a vacuum pump, wherein the control device is in communication with the isolation valve and is configured to activate and deactivate the isolation valve to increase and decrease the pressure within the internal volume of the reactor.

9. The apparatus of claim 1, wherein the at least one reactor pressure control device comprises at least one mass flow controller upstream from and in communication with the reactor, wherein the control device is in communication with the at least one mass flow controller and is configured to increase and decrease process gas flow from the at least one mass flow controller to increase and decrease the pressure within the internal volume of the reactor.

* * * * *

UNITED STATES PATENT AND TRADEMARK OFFICE
CERTIFICATE OF CORRECTION

| | | |
|---|---|---|
| PATENT NO. | : 12,205,803 B2 | Page 1 of 1 |
| APPLICATION NO. | : 17/679448 | |
| DATED | : January 21, 2025 | |
| INVENTOR(S) | : Gilbert Bruce Rayner, Jr. et al. | |

It is certified that error appears in the above-identified patent and that said Letters Patent is hereby corrected as shown below:

On the Title Page

Column 1, Item (72) Inventors, Lines 1-2, delete "Bellefonte, PA (US);" and insert -- Spring Mills, PA (US); --

Signed and Sealed this
First Day of April, 2025

Coke Morgan Stewart
*Acting Director of the United States Patent and Trademark Office*